United States Patent [19]
Sun et al.

[11] Patent Number: 5,173,695
[45] Date of Patent: Dec. 22, 1992

[54] HIGH-SPEED FLEXIBLE VARIABLE-LENGTH-CODE DECODER

[75] Inventors: Ming-Ting Sun, Holmdel; Kou-Hu Tzou, Marlboro, both of N.J.

[73] Assignee: Bell Communications Research, Inc., Livingston, N.J.

[21] Appl. No.: 546,415

[22] Filed: Jun. 29, 1990

[51] Int. Cl.⁵ .............................................. H03M 7/40
[52] U.S. Cl. ........................................ 341/67; 341/65
[58] Field of Search ................ 341/55, 63, 67, 106, 341/65

[56] References Cited

U.S. PATENT DOCUMENTS

| | | | |
|---|---|---|---|
| 3,675,212 | 7/1972 | Raviv et al. | 341/67 |
| 3,701,108 | 10/1972 | Loh et al. | 341/67 |
| 3,701,111 | 10/1972 | Cocke et al. | 341/67 |
| 3,717,851 | 2/1973 | Cocke et al. | 395/375 |
| 3,883,847 | 5/1975 | Frank | 341/106 |
| 3,925,780 | 12/1975 | Van Voorhis | 341/63 |
| 4,044,347 | 8/1977 | Van Voorhis | 341/67 |
| 4,099,257 | 7/1978 | Arnold et al. | 341/67 |
| 4,177,456 | 12/1979 | Fukinuki et al. | 341/67 |
| 4,188,669 | 2/1980 | Rauscher | 395/375 |
| 4,475,174 | 10/1984 | Kanayama | 395/425 |
| 4,580,129 | 4/1986 | Bahgat | 341/67 |
| 4,593,267 | 6/1986 | Kuroda et al. | 341/67 |
| 4,675,652 | 6/1987 | Machado | 341/59 |
| 4,914,675 | 4/1990 | Fedele | 341/67 X |
| 5,032,838 | 7/1991 | Murayama et al. | 341/67 |
| 5,055,841 | 10/1991 | Cordell | 341/67 |
| 5,060,242 | 10/1991 | Arbeiter | 341/67 |

OTHER PUBLICATIONS

"Variable Word Length Coding for a High Data Rate DPCM Video Coder", M. E. Lukacs, Proc. of Picture Coding Symposium (PCS '86), pp. 54–55, 1986.

"Decompaction", J. W. Peake, IBM Technical Disclosure, vol. 26, No. 9, pp. 4794–4797, Feb. 1984.

*Primary Examiner*—Howard L. Williams
*Attorney, Agent, or Firm*—Leonard Charles Suchyta; Stephen M. Gurey

[57] ABSTRACT

A variable-length decoder is disclosed in which a received variable-word-length encoded bit stream is input to a buffer (102) and read out in parallel sequences equal in length to the maximum length codeword. These sequences are read into cascaded latches (105, 107). The cascaded sequences in both latches are input to a barrel shifter (109) which provides from its multi-bit input, a sliding decoding window to a table-lookup memory device (112). A control signal directly shifts the position of the decoding window of the barrel shifter as each codeword is detected. To detect each codeword, the initial bits in the decoding window are compared with the codeword entries in the table-lookup memory. When a codeword is detected, the corresponding stored codeword length is accumulated (120) with previously accumulated codeword lengths to produce the control signal which directly shifts the decoding window by the number of bits in the just decoded word. When all the bits in the first latch have been decoded, the next bit sequence in the buffer is input to the second latch while the previous bit sequence in the second latch is transferred to the first latch. The decoding window is then adjusted to the beginning of the next undecoded sequence.

18 Claims, 5 Drawing Sheets

HIGH-SPEED FLEXIBLE VARIABLE-LENGTH-CODE DECODER

BACKGROUND OF THE INVENTION

This invention relates to decoding codewords in a high speed data transmission system, and more particularly to decoding codewords which have been encoded using a variable-length coding (VLC) scheme.

Variable-length coding is a coding technique often used for lossless data compression. In accordance with this technique, fixed-length data is converted into variable-length codewords according to the statistics of the data. In general, the lengths of the codewords are chosen so that shorter codewords are used to represent the more frequently occurring data and longer codewords are chosen to represent the less frequently occurring data. By properly assigning the variable-length codewords to the library of all possible source codewords, the averaged word length of the variable-length code is shorter than that of the original data and, therefore, data compression is achieved. Huffman code design is a procedure commonly used to construct a minimum redundant variable-length code for a known data statistic. Generally, the encoding process can be implemented by a table-lookup process using the input data to address the table. The codewords and word-lengths are stored as table contents and outputted sequentially, through a buffer, at a constant data rate onto the data channel. At the receiving end, however, the decoding process is more complicated. Due to the variable-length nature, each codeword has to be segmented from the received bit string before it can be decoded into a source symbol. Therefore, the design of a variable-length decoder is always more difficult than the design of a variable-length encoder.

There are several methods to decode a stream of variable-length codewords. The one most often used is called the tree-searching algorithm. A variable-length code can always be represented by a tree with codewords as leaves (also called terminal nodes). The decoding starts from the root of the code tree and is guided by the received bit string to follow one of two branches at each node. When a leaf is reached, the end of a codeword is detected and it is segmented from the remaining string. This type of decoder includes logic circuitry corresponding to the tree and control circuitry to traverse the code tree. This approach may be slow, especially for long codewords, since a bit-by-bit search through the code tree is required for each decoded symbol. In typical applications, an input symbol is represented by several bits. The speed of shifting received bits into a decoder is several times as high as the averaged speed of decoded data. Therefore, the tree-searching based decoder has to be operated at the speed of several times of the output data rate.

Such high-speed requirements are particularly critical for the digital transmission of high definition television (HDTV) signals. In such an HDTV system the total sample rate (combining luminance and chrominance signals) is likely 100 MHz. If variable-length coding is used, the maximum length code word could typically be 16 bits. A bit-by-bit decoder would thus need to shift at 16 times the sample rate, or at 1.6 Gbits/sec, to detect the code words at the sample rate. Such high speeds are very difficult to implement using current IC technology.

Due to the difficulty of implementing high-speed variable-length decoders, there are several special variable-length codes designed for fast and inexpensive decoders. For example, a variable-length encoder with a length-indicating prefix is proposed by J. Cocke et al in U.S. Pat. No. 3,717,851 issued Oct. 24, 1972. In "Variable Word Length Coding for a High Data Rate DPCM Video Coder," *Proc. of Picture Coding Symposium*, 1986, pp. 54–56, M. E. Lukacs proposed a hardware architecture that is capable of fast decoding of specially designed variable length codes. These approaches tradeoff coding efficiency with hardware speed.

A table-lookup based approach is an alternative to the bit-by-bit search operation. In a table-lookup based approach, such as disclosed in U.S. Pat. No. 3,675,212, issued on Jul. 4, 1972 to J. Raviv et al, the received bit string is compared with the contents of a codeword table. The codeword table has an entry associated with each possible variable-length codeword that includes the decoded fixed-length word and the length of the variable-length word. When the sequence of leading bits in an input register matches one of the entries in the codeword table, a codeword match is indicated. The input register is then shifted by the number of bits indicated by code length entry, thereby making the next sequence of bits available for comparison with entries in the codeword table. Disadvantageously, bit-by-bit shifting at the very high speed multiple of the sample rate is required to enable the decoder to maintain the sample rate of decoding.

An object of the present invention is to decode variable-length codewords at the sample rate, regardless of the codeword length, without a need for clocking at a rate equal to the sample rate times the maximum codeword length.

A feature of the present invention is that special variable-length codewords, which would otherwise decrease coding efficiency, are not required.

SUMMARY OF THE INVENTION

The variable-length decoder of the present invention uses a table-lookup technique to decode the sequentially occurring bits in the received bit stream. As in the prior art, a memory device has an entry for each possible input word and associated with each input word is a word length and a fixed-length output codeword. The variable-length decoder of the present invention includes a barrel shifter that provides an output decoding window having a bit width equal to the maximum length codeword. In response to a control signal, the barrel shifter directly shifts its decoding window across a longer sequence of available input bits as each codeword is detected, the decoding window being shifted after each word is decoded by the number of bits corresponding to the length of this just decoded word.

The input data stream to be decoded is input in parallel format from a buffer into the second of two identical cascaded latch circuits, each latch circuit having a bit capacity equal to at least the maximum length codeword. As noted below, at selected times, the sequence in the second latch is transferred into the first latch and the next sequence in the buffer is read into the second latch. The first and second latches therefore together hold a consecutive sequence of bits that is equal in length to at least twice the maximum codeword length. The bits stored in both latch circuits are input to the barrel shifter, which provides a sliding decoding window to the table-lookup memory device of a consecutive subsequence of latch bits that is equal in length to at least the maximum length codeword. When the leading bits in the decoding window of the barrel shifter are matched with the contents of one of the codeword entries in the table-lookup memory device, the fixed-length word and the length of the variable-length word of the corresponding entry are outputted. An accumulator circuit sums the length of the just decoded word with the accumulated lengths of previously decoded words and generates a control signal which directly slides the decoding window of the barrel shifter to the beginning of the yet undecoded bits in the latch circuits. When the total of the accumulated word lengths exceeds the number of bits in the first latch, indicating that all the bits in this latch have been decoded, the bits in the second latch are transferred to the first latch and the next sequence of bits are read into the second latch form the buffer as the position of the decoding window is adjusted.

Advantageously, the architecture of the variable-length decoder of the present invention requires clocking at only the symbol rate thereby lowering the hardware speed constraint.

DETAILED DESCRIPTION

Figure 1:
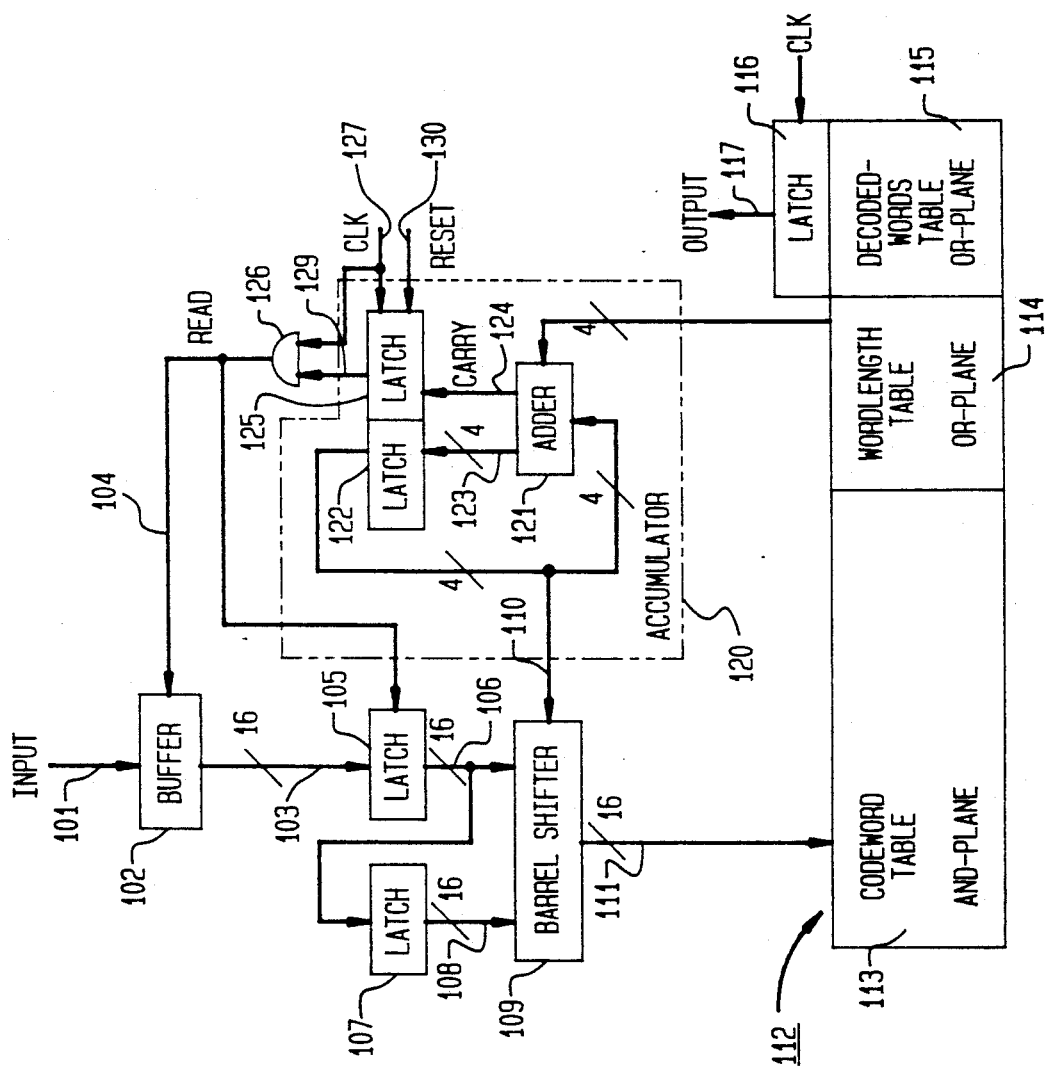
FIG. 1 is a block diagram of the variable-length decoder of the present invention.

In the embodiment of the present invention shown in FIG. 1, it is assumed for illustrative purposes that the maximum length variable-length codeword is 16-bits. The serial data stream received on data channel 101 is input to a buffer 102 which outputs the data in parallel format in 16-bit segments on parallel leads 103 in response to a Read signal on lead 104. Leads 103 are connected to a 16-bit latch 105 whose outputs on parallel leads 106 are connected to the input of an identical 16-bit latch 107. Each time the Read signal on lead 104 is activated, the 16-bits in latch 105 are transferred into latch 107 and the bits in latch 107 are dumped. Latch 107 thus always contains bits which are sequentially earlier in time than the bits in latch 105. The 32-bits in latches 107 and 105 comprise a 32-bit sequence of serial input data to be decoded, which is twice the maximum length codeword.

As will be described, variable-length words are detected starting at the beginning of the bit stream from the sequentially first bit in latch 107. When all the bits in latch 107 have been decoded, the Read signal is activated and, as noted, a new group of 16-bits is loaded into latch 105 while the bits then in latch 105 are loaded into latch 107. Since the maximum length codeword is 16-bits, when the next word in a sequence to be decoded is 16-bit word, it will be fully encompassed within the 32-bit sequence of bits available for decoding in latches 107 and 105.

The 32-bits in latches 107 and 105 are input to a barrel shifter 109 over parallel leads 108 and 106, respectively. The output of barrel shifter 109 on parallel leads 111 is a 16-bit subsequence of the input bits. This 16-bit decoding window is slidable across the 32-bit input to barrel shifter 109 and its position is directly determined by a 4-bit control signal on parallel leads 110 which indicates a shift in the decoding window between zero and fifteen. A control signal of "0" indicates that the window encompasses the first through sixteenth bit from latch 107 while a control signal of "15" indicates that the window encompasses the sixteenth bit in latch 107 through the fifteenth bit in latch 105. As will be described, as each codeword is detected at the sample rate, the barrel shifter is directly shifted to place the next sequence of sixteen undecoded bits of the bit stream within the decoding window. When a shift greater than fifteen occurs, indicating that all bits in latch 107 have been decoded, the 16-bits in latch 105 are input to latch 107 and the next 16-bits are read into latch 105 from buffer 102. Since the decoding window is directly shifted after each codeword is detected, the circuitry need not operate at a rate greater than the sample rate, regardless of the length of the variable-length word detected.

The outputs 111 of barrel shifter 109 are connected to a memory device 112. In the described embodiment, memory device 112 takes the form of a programmable logic array (PLA). The PLA in FIG. 1 is shown as comprising a codeword table AND-plane 113, a word-length table OR-plane 114, and a decoded-words table OR-plane 115, but may actually take the form of two PLAs each having an AND-and an OR-plane. Each codeword is represented as an entry in a codeword table AND-plane 113 according to the bit pattern of the codeword. Within the AND-plane the entry for each codeword consists of 16-bit positions. Since most codewords in a codeword library in which the maximum length word is 16-bits have fewer than 16 bits, the bit positions in the table entry for the bits beyond the actual codeword bit pattern are designated "don't care" positions. A codeword is detected when a sequence of input bits matches the bit pattern of one of the codeword bits patterns stored in the codeword table. Thus, for example, if one of the variable-length codewords is "01", its 16-bit table entry will be "01XXXXXXXXXXXXXX" where each "X" represents a "don't care". If the received bit stream has a pattern "0111110000011101 . . . ", then it is uniquely identified with this table entry since a match occurs on the first two bits. The first two bits are thus recognized as a variable-length word and the next word begins with the third bit.

When the input bits on leads 111 match an entry in the codeword table AND-plane 112, the entry in the word-length table OR-plane 114 and the entry in the decoded-words table OR-plane 115 are activated. The decoded words table OR-plane 115 outputs into latch 116 the fixed length codeword corresponding the matched variable-length word in the codeword table 113. This fixed-length word is shown as an 8-bit word and is output onto parallel leads 117 from latch 116 in response to a clock signal at the sample rate.

The word-length table OR-plane 114 produces an output signal on parallel leads 118 that indicates the length of matched variable-length codeword in the codeword table 113. For the example above, the word-length table 114 outputs a "2", representing the length of the detected word, "01". This word-length, on leads 118, is input to an accumulator circuit 120 which accumulates the decoded word lengths and generates the signal on leads 110 used to control barrel shifter 109. Leads 118 are connected to an adder 121 which sums, modulo 16, the word-length of the just detected codeword with the previous accumulated modulo 16 word-lengths in latch 122 on leads 110 to produce a 4-bit output on leads 123. This new accumulated sum in latch 122 is output on leads 110 to barrel shifter 109 which shifts the position of the decoding window to the next undecoded bits in latches 107 and 106.

When the sum of the word-length on leads 118 plus the previously accumulated modulo 16 word-lengths in latch 122 exceeds 15, adder 121 activates a carry lead 124 that indicates that all the bits in latch 107 have been decoded and can now be discarded. This carry "1" in latch 125 is output on lead 129 to enable AND gate 126. At the next sample clock cycle, a clock pulse on lead 127 is passed through AND gate 126 to the Read lead 104 which, as previously discussed, brings the next 16-bit sequence in buffer 102 into latch 105 while transferring the contents of latch 105 to latch 107. It can be seen, therefore, that Read lead 104 is activated only after all the bits in latch 107 have been decoded which, depending on the length of the decoded words, can be several clock cycles duration.

At the beginning of a bit stream, reset lead 130 is activated which places a "1" in latch 125 and a "0" in latch 122. AND gate 126 is energized and reset lead 130 remains active for two clock cycles enabling the first two sequences of bits to be read from buffer 102 into latches 106 and 107. The "0" in latch 122 initializes the decoding window at the "0" shift position so that the first bits of these two sequences are the first to be decoded.

Figure 2:
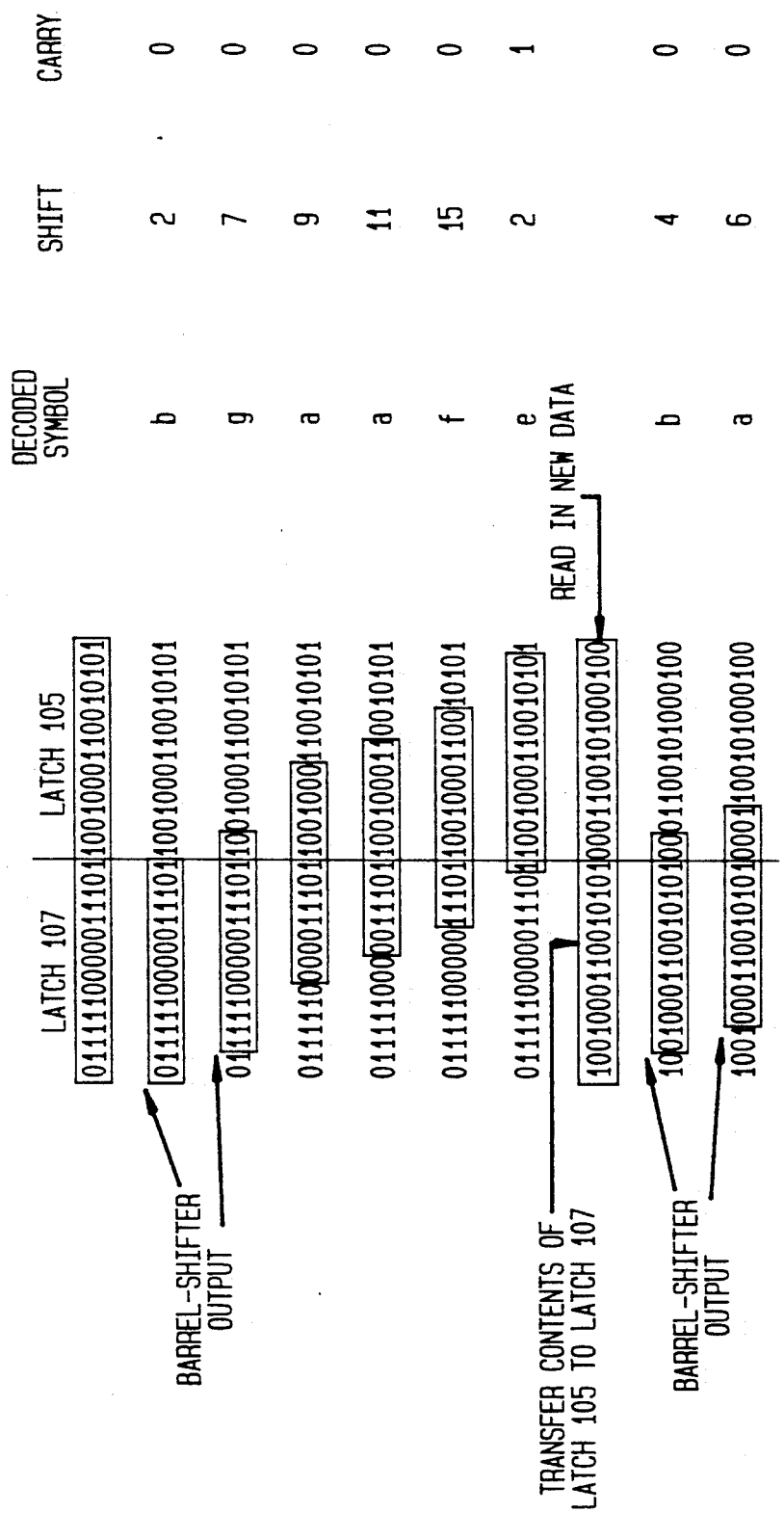
FIG. 2 is an example of the operation of the variable-length of FIG. 1.

An example of the operation of the decoder in FIG. 1 during decoding is shown in FIG. 2. The variable-length code shown in Table 1 is used in this example. The source sequence is 'bgaafeba . . . ' and the corresponding coded bit string is '0111110000011101100100 . . . .'The contents of latches 105 and 107, the bit output of barrel shifter 109, the decoded symbol, the shift of barrel shifter 109 relative to its beginning position, the carry output of adder 121, and the Read control are shown in their time sequence.

TABLE 1

| A sample VLC with eight codewords. | | |
|---|---|---|
| input | word-length | codeword |
| a | 2 | 00 |
| b | 2 | 01 |
| c | 3 | 100 |
| d | 3 | 101 |
| e | 3 | 110 |
| f | 4 | 1110 |
| g | 5 | 11110 |
| h | 5 | 11111 |

In this illustration, one can verify that source symbols are correctly decoded one by one in each clock sequence. At the first clock cycle, the first two bits of barrel shifter 109 output are recognized as the symbol "b" by the codeword table 113 of memory device 112. The word-length table 114 thus outputs a "2" which is added to the previous "0" in adder 121 causing barrel shifter 109 to instantly shift its decoding window two positions to the right. At the second clock cycle, the first five bits in the decoding window are recognized as symbol "g". The "5" output by word-length table 114 is added by adder 121 to the previous "2" causing barrel shifter 109 to shift its decoding window to the seventh position relative to its initial zeroth position. At the sixth clock cycle barrel shifter 109 output extends from the 16th bit of latch 107 through the 15th bit of latch 105. The first three bits in this decoding window are recognized as symbol "e". Since the addition of "3" to the "15" then in adder 121 exceeds sixteen, carry lead 124 is energized causing the contents of latch 105 to be transferred into latch 107 and a new 16-bit sequence to be read into latch 105. The resultant modulo sum of "3" plus "15" is "2" which is the shift of barrel shifter 109 after the data transfer. As can be noted, the carry output is reset to zero after the transfer.

The advantages of the structure of the variable-length decoder of the present invention can be readily seen from the example. In particular, it can be noted that clocking is required at only at the sample clock rate. Since barrel shifter 109 instantly changes its decoding window in response to the control signal on lead 110, high-speed shifting of bits is not required.

The design of a variable-length code is based on the known statistics of a source. For mixed sources, the variable-length code is usually designed based upon the mixed statistics of the underlying sources. This single variable-length code table approach simplifies the hardware requirement. However, the compression efficiency of this system is not as good as the one with a dedicated variable-length code for each individual source since the probability distribution of the mixed source is different from that of each individual source.

Figure 3:
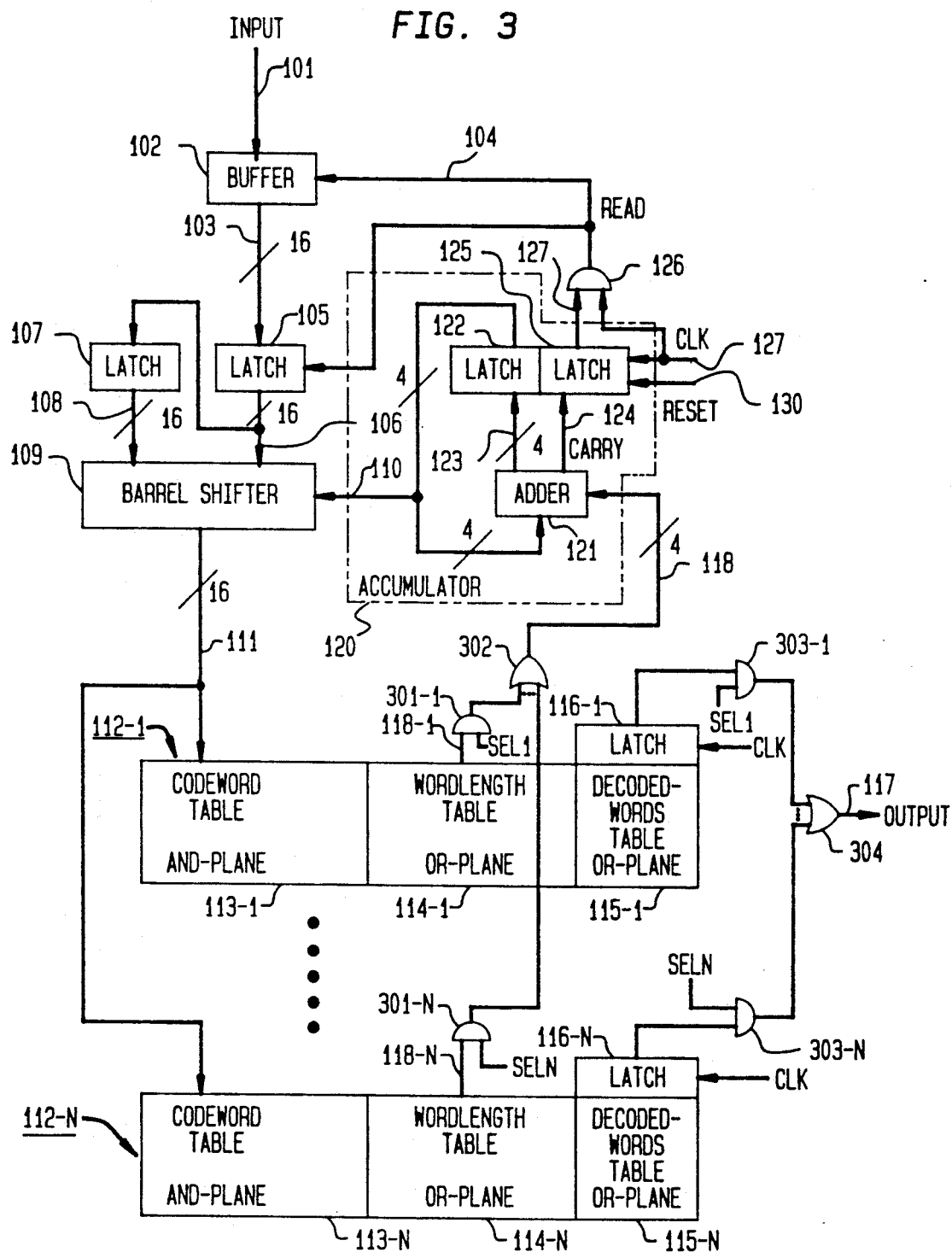
FIG. 3 is a block diagram of another embodiment of the present invention in which multiple code tables are available for decoding a received signal.

The embodiment of the present invention shown in FIG. 3 implements a multi-table variable-length code decoder using a modification of the architecture of the decoder of FIG. 1. The same numerical designations are given to those elements which also appear in FIG. 1. In FIG. 3, instead of one memory device serving as a codeword table, multiple memory devices 112-1 through 112-N are used for the multi-table variable-length code decoder, where N is the total number of codeword tables.

The parallel outputs 111 of barrel shifter 109 are connected to the codeword tables, 113-1 through 113-N, of the N memory devices 112-1 through 112-N, respectively. Each of the outputs, 118-1 through 118-N, of the corresponding word-length tables, 114-1 through 114-N, are individually connected to first inputs of AND gates 301-1 through 301-N, respectively. A SELx control signal, where x=1,2, . . . N, is applied to the second input of each AND gate and the outputs of AND gates 301-1 through 301-N are all connected to OR gate 302. The output of OR gate is connected to the input of adder 121. In order to simplify the drawing, one AND gate is shown connected to a single output of each word-length table 114. Since the output of each word-length table 114 actually consists of four parallel outputs, four AND gates are actually required, with the outputs of each being connected to separate OR gates. The four OR gates then provide the four parallel lead inputs to the adder 121.

The outputs of the latches 116-1 through 116-N are similarly connected to first inputs of AND gates 303-1 through 303-N. The SELx control signal is applied to second inputs of these AND gates and the outputs of these gates are connected to an OR gate 304. As described above, multiple AND gates and OR gates are used for the plural parallel outputs of the latches.

By externally energizing the appropriate SELx control signal, the outputs of only the desired word-length table is input to adder 121 and the corresponding codewords in the decoded-words table is output on output leads 117.

Figure 4:
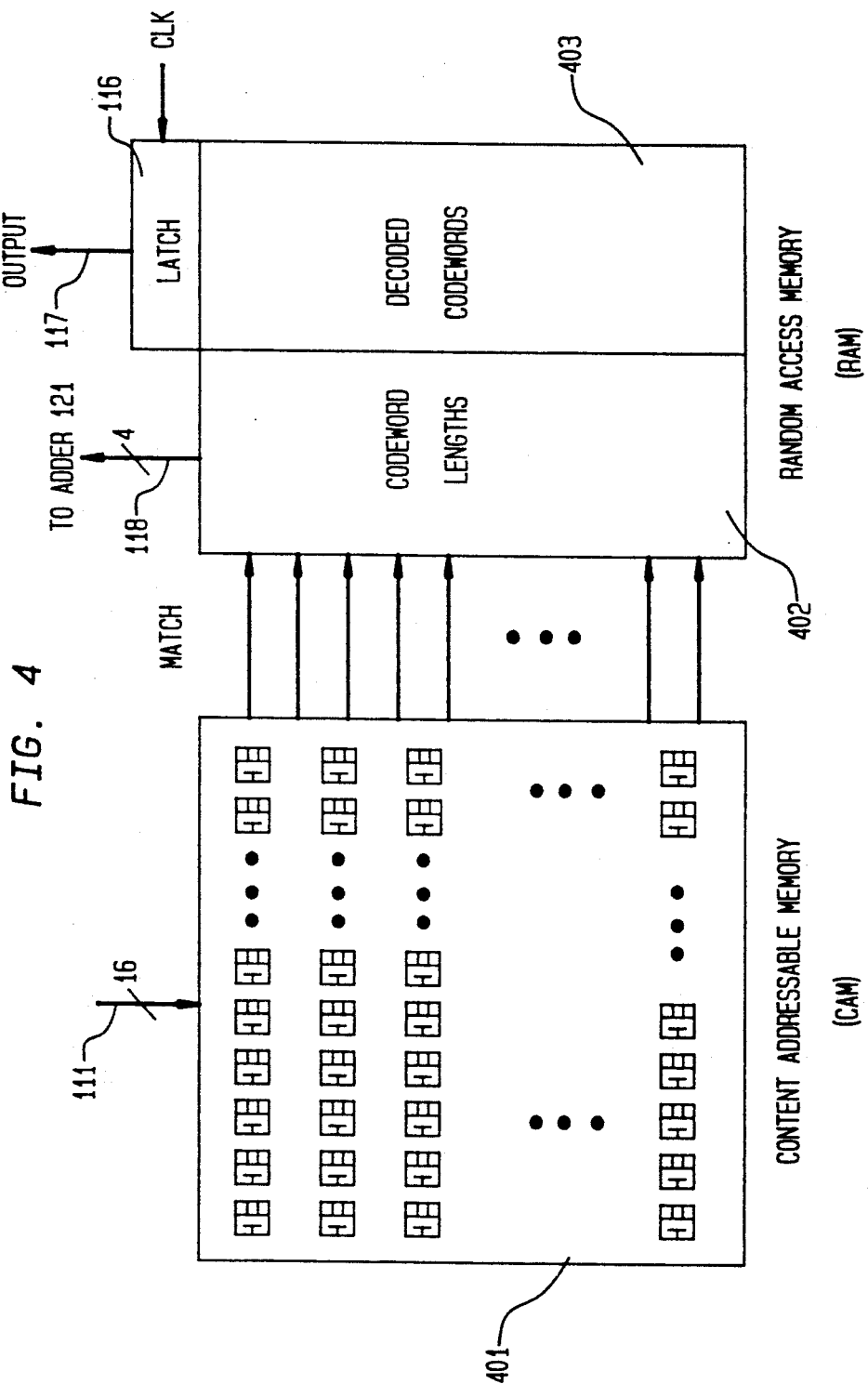
FIG. 4 is a block diagram of a lookup-table memory device incorporating a content addressable memory (CAM) and random access memory (RAM)

Although the multiple code embodiment described above has greater flexibility than the single code embodiment of FIG. 1, once a chip is fabricated using one or plural PLA memory devices, the code tables are fixed and cannot be changed by the user. A user-programmable variable-length decoder therefore has more general applications. One way to achieve the user-programmability with standard low-cost CMOS technology is to replace the programmable logic arrays used in FIG. 1 by a content addressable memory (CAM) and random access memory (RAM) modules shown in FIG. 4. The CAM 401 replaces the AND-plane codeword table 112, RAM 402 replaces the OR-plane word-length table 114, and RAM 403 replaces the OR-plane decoded words table 115, of FIG. 1. The variable-length code tables are stored in an off-chip EPROM (Erasable-Programmable Read-only Memory) and down-loaded to the CAM 401 and RAM 402 and 403, before commencing operation.

Figure 5:
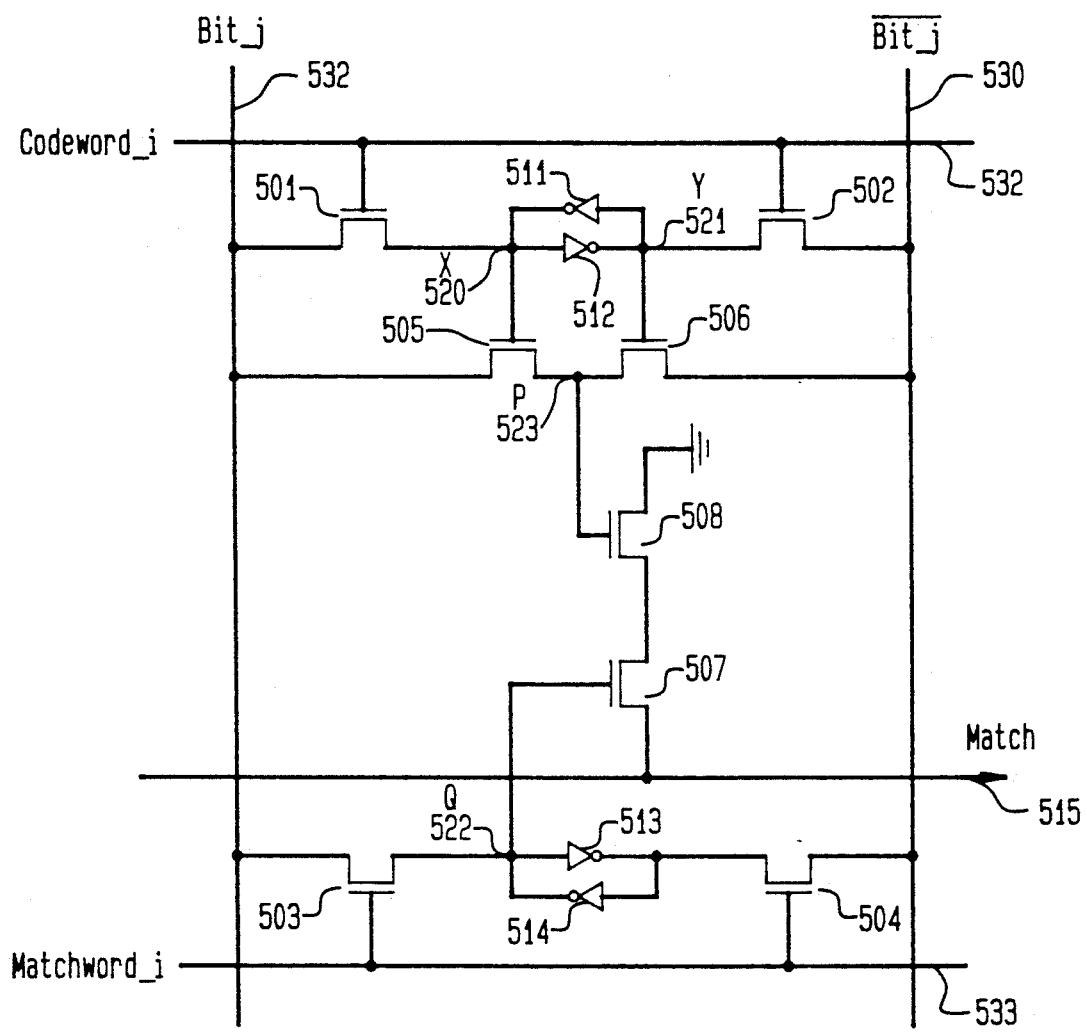
FIG. 5 is a schematic diagram of a memory cell for a content addressable memory that can be used in the lookup-table memory device of FIG. 4.

In order to use a CAM as a codeword table for a variable-length code, the cells of the CAM need be able to incorporate a "don't care" feature. A cell shown in FIG. 5 can be programmed to be a "1"-cell which matches a "1" pattern, a "0"-cell which matches a "0" pattern, or a "don't care"-cell. The cell contains two regular static RAM bits and four transistors 505 through 508. The upper bit (formed by the transistors 501, 502 and the inverters 511, 512) is called a codeword-bit. The lower bit (formed by the transistors 503, 504 and the inverters 513, 514) is called a match-bit. In order to program the cell as a "1", "0" or "don't care" cell, "0" and "1" patterns are stored in the codeword-bits and the match-bits. When a pattern it matched, the Match line 515 is "1". Otherwise, the Match line 515 becomes "0".

In order to program the cell to be a "1"-cell, a "0" is stored at X 520, a "1" at Y 521, and a "1" at Q 522. To program the cell to be a "0"-cell, a "1" is stored at X 520, a "0" at Y 521, and a "1" at Q 522. To program the cell to be a "don't-care" cell, a "0" is stored at Q 522. This programming operation is the same as the regular operation to write data into the RAM cells as explained below.

To store a "0" at X 520 and a "1" at Y 521, a "0" is put on Bit_j lead 531, a "1" on $\overline{\text{Bit}}$_j lead 530, a "1" on Codeword_i lead 532, and a "0" on Matchword_i lead 533. Since the codeword_i lead 532 is "1", the transistors 501 and 502 are "on", so the "0" on Bit_j lead 531 is stored at X 520 and the "1" on $\overline{\text{Bit}}$_j lead 530 is stored at Y 521. To store a "1" at X 520 and a "0" at Y 521, a "0" is put on Bit_j lead 531, a "1" on $\overline{\text{Bit}}$_j lead 530, a "1" on Codeword_i lead 532, and a "0" on Matchword_i lead 533. Similarly, to store a "1" at Q 522, a "1" is put on Bit_j lead 531, a "0" on $\overline{\text{Bit}}$_j lead 530, a "0" on Codeword_i lead 532, and a "1" on Matchword_i lead 533. To store a "0" at Q 522, a "0" is put on Bit_j lead 531, a "1" on $\overline{\text{Bit}}$_j lead 530, a "0" on Codeword_i lead 532, and a "1" on Matchword_i lead 533.

After the programming, for each cell, the Codeword_i lead 532 and Matchword_i lead 533 are kept "0" so that the transistors 501 through 504 are always "off" and the values stored at X 520, Y 521, and Q 522, are not disturbed. In normal operations, all the Bit_j 531 and $\overline{\text{Bit}}$_j 530 leads are first discharged to "0" and the Match 515 lines are precharged to "1". The input data to be matched are then placed in each cell on the Bit_j 531 leads and the inverted data values are put of the $\overline{\text{Bit}}$_j 530 leads. If a "0" is stored at Q 522, then transistor 507 is always "off". This cell, therefore has no effect on the Match line 515, i.e. this bit is a "don't care". The value of the Match line 515 is then determined by other bits. If a "1" is stored at Q 522, then transistor 507 is always "on" and the value of the Match line 515 is determined by the transistor 508.

If the cell is a "0"-cell, then X 520 is "1" and Y 521 is "0". Therefore transistor 505 is "on" and transistor 506 is "off". If the data of the Bit_j lead 531 is "1", P 523 will be "1". Transistor 508 will be "on" and the Match lead 515 is pulled to "0" indicating a mismatch. If the input data of Bit_j lead 531 is "0", P 523 is "0" and transistor 508 is "off" and the Match lead 505 remains "1".

If the cell has been programmed as a "1"-cell, the X 520 is "0" and Y 521 is "1". Transistor 505 is thus "off" and transistor 506 is "on". If Bit_j lead 531 is "1", $\overline{\text{Bit}}$_j lead 530 is "0" and P 523 is "0". The Match lead 505 remains "1" thus indicating a match. If Bit_j lead 531 is "0", $\overline{\text{Bit}}$_j lead 530 is "1" and P 523 is "1". Match lead 515 is thus pulled to "0", indicating a mismatch. In each group of cells associated with each possible codeword, if one bit of the input sequence is not matched, the Match line 515 is pulled to "0" thereby indicating that the input is not a match with the codeword stored in that group. Only the codeword that perfectly matches enables Match line 515 to remain "1" which is then used to read out the decoded codeword and word-length in the associated RAMs.

The above-described embodiments are illustrative of the principles of the present invention. Other embodiments could be devised by those skilled in the art without departing from the spirit and scope of the present invention.

What is claimed is:

1. A variable-length decoder for decoding an input bit stream of variable-length codewords during each cycle of a fixed clock comprising:
    first and second cascaded bit storage means each having a bit capacity for storing fixed-length parallel sequences of bits from said input bit stream that are equal in bit-length to at least the longest-length variable-length codeword, said first and second bit storage means providing on parallel output leads a consecutive sequence of bits from said input bit stream that is equal in length to at least twice the longest-length variable-length codeword;
    a barrel shifter having parallel inputs connected to said parallel outputs of said first and second bit storage means and a plurality of parallel outputs, said plurality of outputs being equal to at least the number of bits in the longest-length variable-length codeword, said barrel shifter providing on its parallel outputs a directly slidable decoding window of a subsequence of consecutive bits in said first and second storage at its parallel inputs, the position of said decoding window being determined during each clock cycle by an applied control signal;
    table-lookup memory means connected to the outputs of said barrel shifter, said table-lookup memory means having a stored input entry for each variable-length codeword and stored corresponding output entries for the length of each variable-length codeword and for the fixed-length codeword associated with each variable-length codeword, said table-lookup memory means for decoding a variable-length codeword by matching the initial bits in said subsequence of bits in the decoding window of said barrel shifter with a variable-length codeword entry and for producing a first output equal to the corresponding stored fixed-length codeword and a second output equal to the corresponding stored codeword length; and accumulator means for adding during each clock cycle the length of the decoded variable-length codeword with the accumulated codeword lengths of variable-length codewords decoded during previous clock cycles, said accumulator means generating said control signal during each clock cycle to directly shift the decoding window of said barrel shifter by the number of bits in the decoded variable-length code word to the beginning of the next undecoded subsequence of bits at the inputs to said barrel shifter, and for generating a read signal when the accumulated codeword lengths indicate that all the bits in said first bit storage means have been decoded, said read signal transferring the bits in the second bit storage means into the first bit storage means and to read in the next parallel sequence of input bits into the second bit storage means, whereby the decoding window of the barrel shifter is directly shifted to begin at the first bit in the first storage means that is not yet decoded.

2. A variable-length decoder in accordance with claim 1 wherein said table-lookup memory means comprises at least one set of programmable logic arrays.

3. A variable-length decoder in accordance with claim 2 wherein said set of programmable logic arrays comprises a first programmable logic array comprising a codeword table AND-plane for storing the plural variable-length codewords and a word-length table OR-plane for storing the corresponding code word length of each variable-length codeword; and a second programmable logic array comprising a codeword table AND-plane identical to the AND-plane in said first programmable array, and a decoded-words table OR-plane for storing the fixed-length codewords corresponding to each variable-length codeword.

4. A variable-length decoder in accordance with claim 1 wherein said table-lookup memory means comprises plural sets of programmable logic arrays, each set of programmable logic arrays storing different variable-length code tables.

5. A variable-length decoder in accordance with claim 4 wherein an external control signal selects one of the sets of programmable logic arrays to decode the input bit stream.

6. A variable-length decoder in accordance with claim 1 wherein said table-lookup memory means comprises a content addressable memory and a random access memory, said content addressable memory storing the plural variable-length codewords, and said random access memory storing the corresponding codeword lengths and fixed-length codewords.

7. A variable-length decoder in accordance with claim 6 wherein said content addressable memory comprises plural memory cells for each variable-length codeword, wherein each of said cells can be programmed as a "1" cell, a "0" cell, or a "don't care" cell.

8. A variable-length decoder in accordance with claim 1 wherein said accumulator means comprises means for summing modulo-(the number of bits in said fixed length input sequences) the length of the decoded variable-length word with the sum of the lengths of previously decoded variable-length words, said summing means producing said read signal only when said sum exceeds said fixed number of bits.

9. A method of decoding an input bit stream of variable-length codewords during each cycle of a fixed clock comprising the steps of:

storing first and second sequential sequences of input bits, each sequence being equal in length to at least the longest-length variable-length codeword;

during each clock cycle forming from said two stored sequences a decoding window of a subsequence of input bits that is equal in length to at least the longest-length variable-length codeword;

comparing the initial bits in said decoding window with all possible variable-length codewords to determine one particular matching codeword;

during each clock cycle generating a fixed-length output codeword corresponding to the matched variable-length codeword;

generating a signal during each clock cycle that represents the bit-length of the matched variable-length codeword;

directly shifting the decoding window during each clock cycle by the number of bits in the matched variable-length codeword;

accumulating the bit-lengths of each matched variable-length codeword during each clock cycle; and reading in a next sequence of input bits and storing the second sequence of input bits in place of the first sequence of bits together with this next sequence of input bits when the accumulated bit-lengths indicate that all the bits in the first input sequence have been decoded.

10. The method of claim 9 further comprising the steps of:

selecting one of a plurality of different sets of variable-length codewords for matching the bits in the decoding window with, wherein the comparing step compares the initial bits in the decoding window with all possible variable-length codewords in the selected set.

11. A variable-length decoder for decoding an input bit stream of variable-length codewords during each cycle of a fixed clock comprising:

first and second bit storage means each having a bit capacity for storing consecutive sequences of bits from said input bit stream that are equal in bit-length to at least the longest-length variable-length codeword;

shifter means connected to said first and second bit storage means for providing a decoding window output subsequence of consecutive bits in said first and second storage means that is at least equal in bit-length to the longest-length codeword, said decoding window being directly slidable across the bits in said first and second storage means and whose position is determined during each clock cycle by a control signal;

memory means connected to said shifter means, said memory means having a stored input entry for each variable-length codeword and stored corresponding output entries for the length of each variable-length codeword and for the fixed-length codeword associated with each variable-length codeword, said memory means for decoding a variable-length codeword by matching the initial bits in said subsequence of bits in the decoding window of said shifter means with a variable-length codeword entry and for producing a first output equal to the corresponding stored fixed-length codeword and a second output equal to the corresponding stored codeword length; and accumulator means for adding during each clock cycle the length of the decoded variable-length word to the accumulated codeword lengths of variable-length codewords decoded during previous clock cycles, said accumulator means generating said control signal during each clock cycle to directly shift said decoding window by the number of bits in said just decoded variable-length word, and when the accumulated codeword lengths indicate that all the bits in the first storage means have been decoded said accumulator means generating a read signal to transfer the sequence of bits in the second storage means to the first storage means and to read a next sequence of input bits into the second storage means, whereby said control signal directly shifts the decoding window to begin at the first bit in the first storage means not yet decoded.

12. A variable-length decoder in accordance with claim 11 wherein said memory means comprises table-lookup means having at least one set of programmable logic arrays.

13. A variable-length decoder in accordance with claim 12 wherein said set of programmable logic arrays comprises a first programmable logic array comprising a codeword table AND-plane for storing the plural variable-length codewords and a word-length table OR-plane for storing the corresponding codeword length of each variable-length codeword; and a second programmable logic array comprising a codeword table AND-plane identical to the AND-plane in said first programmable array, and a decoded-words table OR-plane for storing the fixed-length codewords corresponding to each variable-length codeword.

14. A variable-length decoder in accordance with claim 11 wherein said memory means comprises table-lookup means having plural sets of programmable logic arrays, each set of programmable logic arrays storing different variable-length code tables.

15. A variable-length decoder in accordance with claim 14 wherein an external control signal selects one of the sets of programmable logic arrays to decode the input bit stream.

16. A variable-length decoder in accordance with claim 11 wherein said memory means comprises table-lookup means having a content addressable memory and a random access memory, said content addressable memory storing the plural variable-length codewords, and said random access memory storing the corresponding codeword lengths and fixed-length codewords.

17. A variable-length decoder in accordance with claim 16 wherein said content addressable memory comprises plural memory cells for each variable-length codeword, wherein each of said cells can be programmed as a "1" cell, a "0" cell, or a "don't care" cell.

18. A variable-length decoder in accordance with claim 11 wherein said accumulator means comprises means for summing modulo-(the number of bits in said fixed length input sequences) the length of the decoded variable-length word with the sum of the lengths of previously decoded variable-length words, said summing means producing said read signal only when said sum exceeds said fixed number of bits.

* * * * *